(12) United States Patent
Zhang et al.

(10) Patent No.: US 7,895,734 B2
(45) Date of Patent: Mar. 1, 2011

(54) CAMERA MODULE INSERTION MACHINE WITH GRIPPER

(75) Inventors: Richard Changchun Zhang, Waterloo (CA); Ming Zhang, Waterloo (CA); Brent Ellis, Cambridge (CA); Fintan Doyle, Waterloo (CA)

(73) Assignee: Research In Motion Limited, Waterloo (CA)

( * ) Notice: Subject to any disclaimer, the term of this patent is extended or adjusted under 35 U.S.C. 154(b) by 112 days.

(21) Appl. No.: 12/266,808

(22) Filed: Nov. 7, 2008

(65) Prior Publication Data

US 2010/0119352 A1 May 13, 2010

(51) Int. Cl.
*B23P 19/00* (2006.01)
(52) U.S. Cl. .............................. 29/739; 29/740; 294/94
(58) Field of Classification Search .................. 29/739, 29/740; 294/94.1
See application file for complete search history.

(56) References Cited

U.S. PATENT DOCUMENTS

| | | | | |
|---|---|---|---|---|
| 3,632,973 A | * | 1/1972 | O'Keefe | 219/230 |
| 3,785,507 A | * | 1/1974 | Wiesler et al. | 29/700 |
| 4,161,064 A | | 7/1979 | Woodman, Jr. et al. | |
| 4,290,732 A | * | 9/1981 | Taki et al. | 198/468.4 |
| 4,420,878 A | | 12/1983 | Tripp et al. | |
| 4,494,902 A | * | 1/1985 | Kuppens et al. | 221/74 |
| 4,815,203 A | | 3/1989 | Jackson | |
| 4,881,319 A | * | 11/1989 | Yagi et al. | 29/840 |
| 5,306,166 A | | 4/1994 | Kula et al. | |
| 6,505,397 B1 | * | 1/2003 | Mimata et al. | 29/740 |

OTHER PUBLICATIONS

SCARA (Selective Compliant Assembly Robot Arm or Selective Compliant Articulated Robot Arm), http://en.wikipedia.org/wiki/SCARA, printed Nov. 3, 2008 (2 pages).
EPO: Communication (extended European search report) for European Patent Application No. 08168584.4 mailed Feb. 23, 2009 (6 pages).
STMicroelectronics Imaging Division, 724 Insertion Tool and 724 Socket Insertion, Jul. 11, 2007 (2 pages).

* cited by examiner

*Primary Examiner*—C. J Arbes
(74) *Attorney, Agent, or Firm*—Jones Day; Krishna K. Pathiyal; Robert C. Liang (57) ABSTRACT

An assembly system includes an electronic component, a gripper, and a socket. The electronic component has sides and a top face, the top face has a top-face peripheral area and a top-face central area. The gripper has a gripper head, the gripper head being movable to an open and closed position. The gripper head has an extension configured to contact opposing sides of the electronic component when the gripper head is in the closed position, and a surface configured to contact the top-face peripheral area of the electronic component when the gripper head is in the closed position. The socket has a top peripheral surface. An insertion depth guide is associated with the gripper head and has a depth guide with a bottom surface configured to contact the top peripheral surface of the socket. A method for assembly is also included.

20 Claims, 12 Drawing Sheets

CAMERA MODULE INSERTION MACHINE WITH GRIPPER

FIELD

The technology described in this patent document relates generally to the field of manufacturing and more particularly to the field of manufacturing mobile devices.

BACKGROUND

Electronic devices are typically assembled with automated systems or in combination with manual labor. Sensitive components such as camera units require special handling to prevent them from being damaged, and it has proven difficult to use automated systems effectively for inserting such components into sockets in electronic devices. Manual assembly is an alternative for handling such components. However, manual assembly also has problems. Human error, such as failure to correctly orient or fully secure the component, is a common issue with manual assembly. Furthermore, manual assembly typically costs more than automated systems.

DETAILED DESCRIPTION

An example assembly system, gripper apparatus, and method are presented herein.

Figure 1:
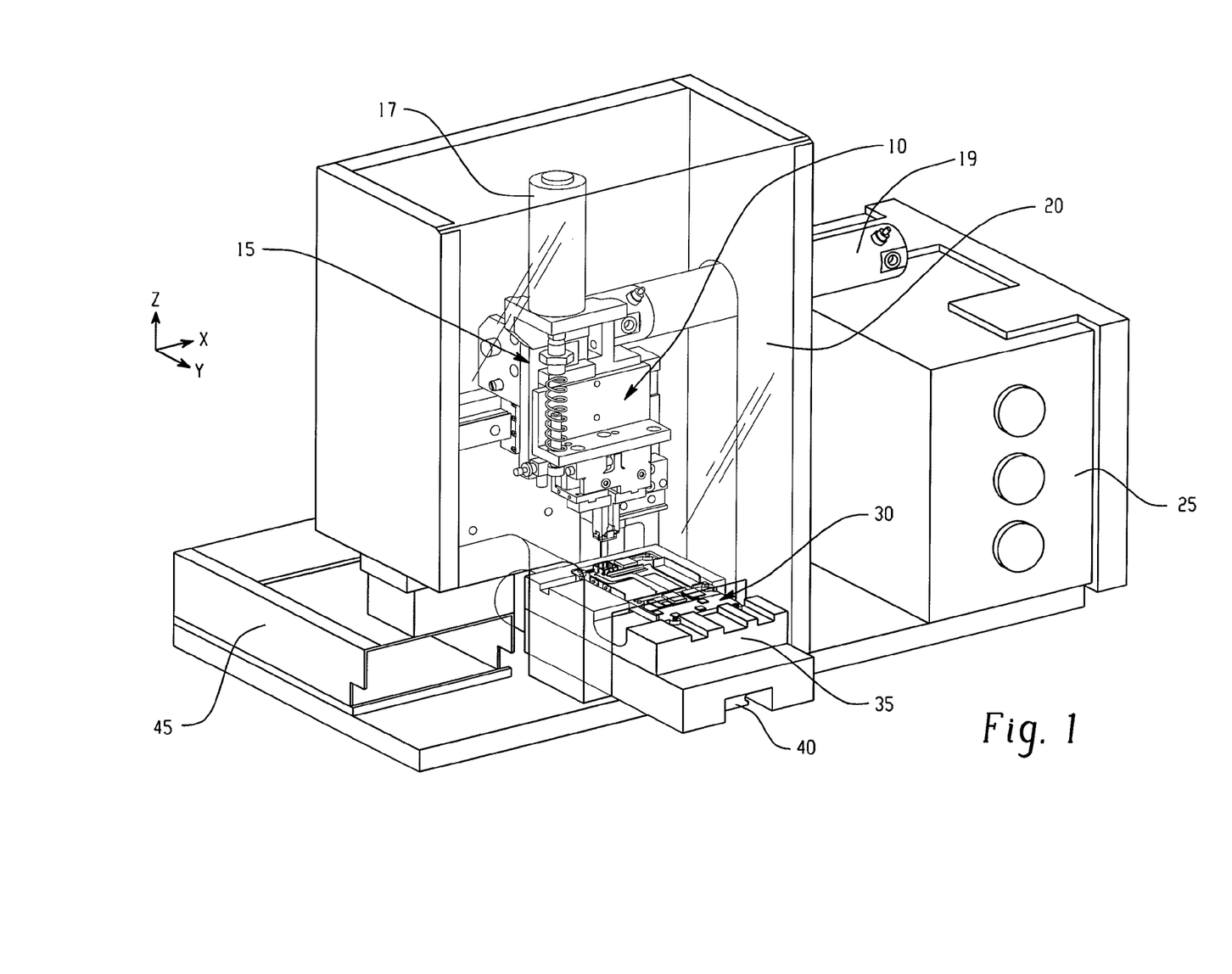
FIG. 1 shows a perspective view of an example assembly mechanism that includes an example gripper apparatus.

FIG. 1 shows a general overview of an example gripper apparatus assembly system. A gripper assembly 10 is secured to a gripper support structure 15. An air cylinder 17 is also mounted on the support structure 15 and is coupled to the gripper assembly 10. These components are enclosed in a machine guard 20. An electrical enclosure 25 houses a power source and computer controller (not shown) that provides power and computer control to the gripper assembly 10 through an electrical coupling. The gripper assembly 10 is pneumatically operated with a built in centering device. Beneath the gripper assembly 10 is a printed circuit board (PCB) 30 that is nestled in a PCB nest 35. In other examples, another part to be assembled may be used in place of the PCB 30. The PCB nest 35 and PCB 30 travel along a rail 40 in and out from under the gripper assembly 10. Each PCB 30 stops at a pre-determined location underneath the gripper assembly 10 and then moves out after an electronic component is installed. A tape feeder 45 is situated to the side of the gripper assembly 10 (along the x-axis) and an opening is provided in the side and bottom of the machine guard 20 to allow the gripper assembly 10 to move along the x-axis and locate above the tape feeder 45. A corresponding opening is located in the top of the tape feeder 45. Electronic components are provided on a moving "tape" for the gripper assembly 10 to pick up and assemble into the PCB 30. In this example the "tape" moves alongside with the PCB nest 35 along the y-axis, providing an electronic component for each PCB that comes underneath the gripper assembly 10.

Figure 2:
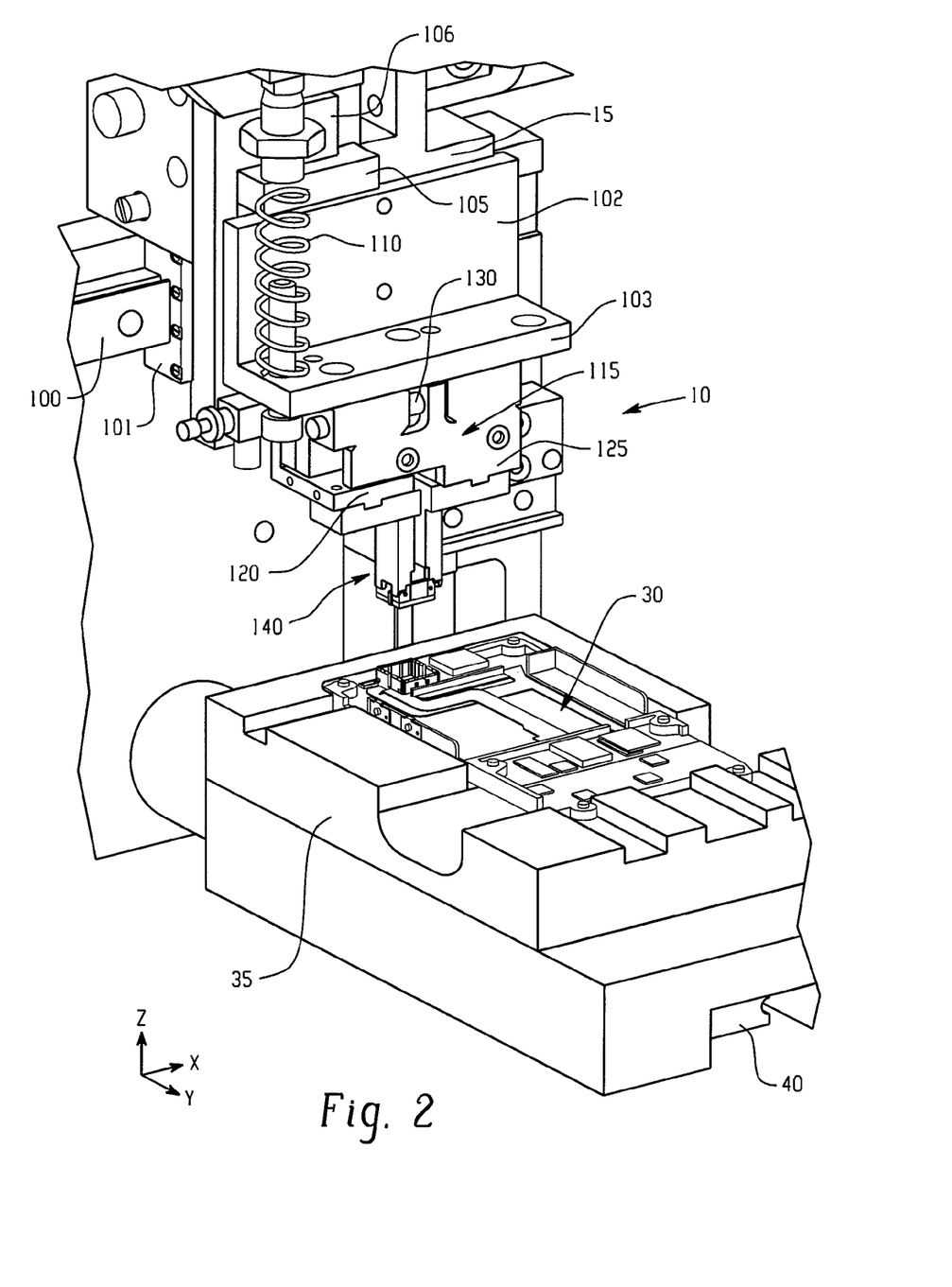
FIG. 2 is a magnified, perspective view of an example gripper apparatus and an example assembly track.

FIG. 2 shows a closer view of the example assembly system with the machine guard 20 removed from the view for clarity. The gripper assembly 10 is mounted on the support structure 15 so that the gripper assembly 10 can move relative to the support structure 15 on the z-axis. The air cylinder 17 is computer controlled and provides the force to move the gripper assembly 10 in the z-axis, although it is appreciated that other similar mechanisms may be suitable for enabling movement of the assembly 10. The support structure 15 is mounted on a rail 100 through a sliding x-axis mounting 101. This linear slide mechanism allows the support structure 15 and gripper assembly 10 to travel on the x-axis. Movement along the x-axis is powered by a computer-controlled air cylinder 19 (FIG. 1), although it is recognized that alternative mechanisms may be appropriate for providing movement of the assembly 10.

An L-shaped angled mounting plate 102 extends in the x and z plane and a bottom ledge 103 extends in the x and y plane. The L-shaped angled mounting plate 102 is secured to a sliding z-axis mounting 105 and, at the bottom ledge 103, is coupled to the gripper assembly 10 by a spring 110. The sliding z-axis mounting 105 is, in turn, coupled to a rail 106 on the support structure 15, forming a linear slide mechanism. The spring 110 provides force control to dampen the z-axis force provided from the air cylinder 17. In this example, the spring 110 is a coil spring; however, in other examples different types of springs may be used, or other types of biasing mechanisms may also be used. Furthermore, more than one spring or biasing mechanism may optionally be used, which may provide greater stability.

Figure 7:
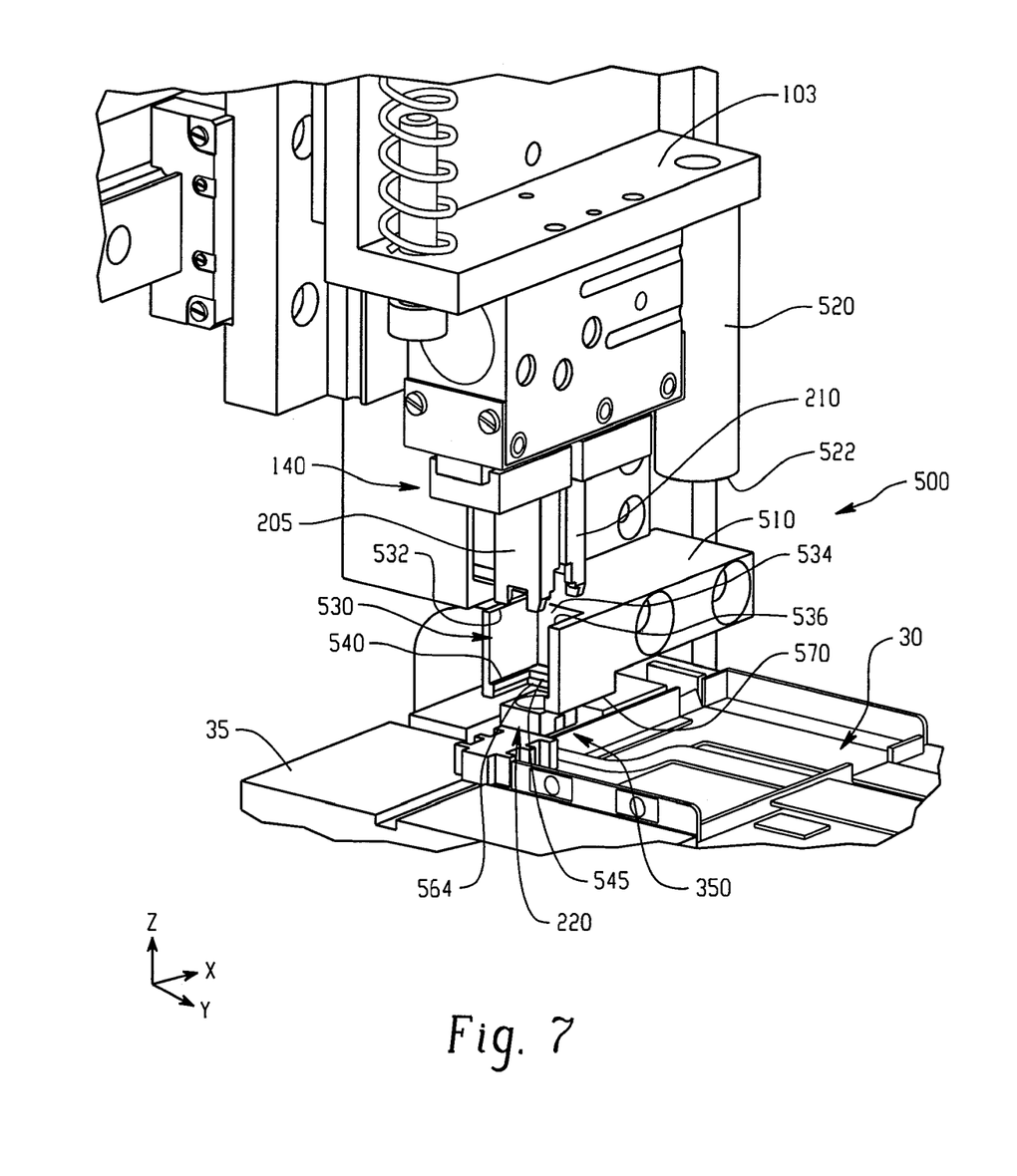
FIG. 7 shows a magnified perspective view of an example gripper apparatus including an example control block and insertion height control rod, and an example assembly track.
Figure 8:
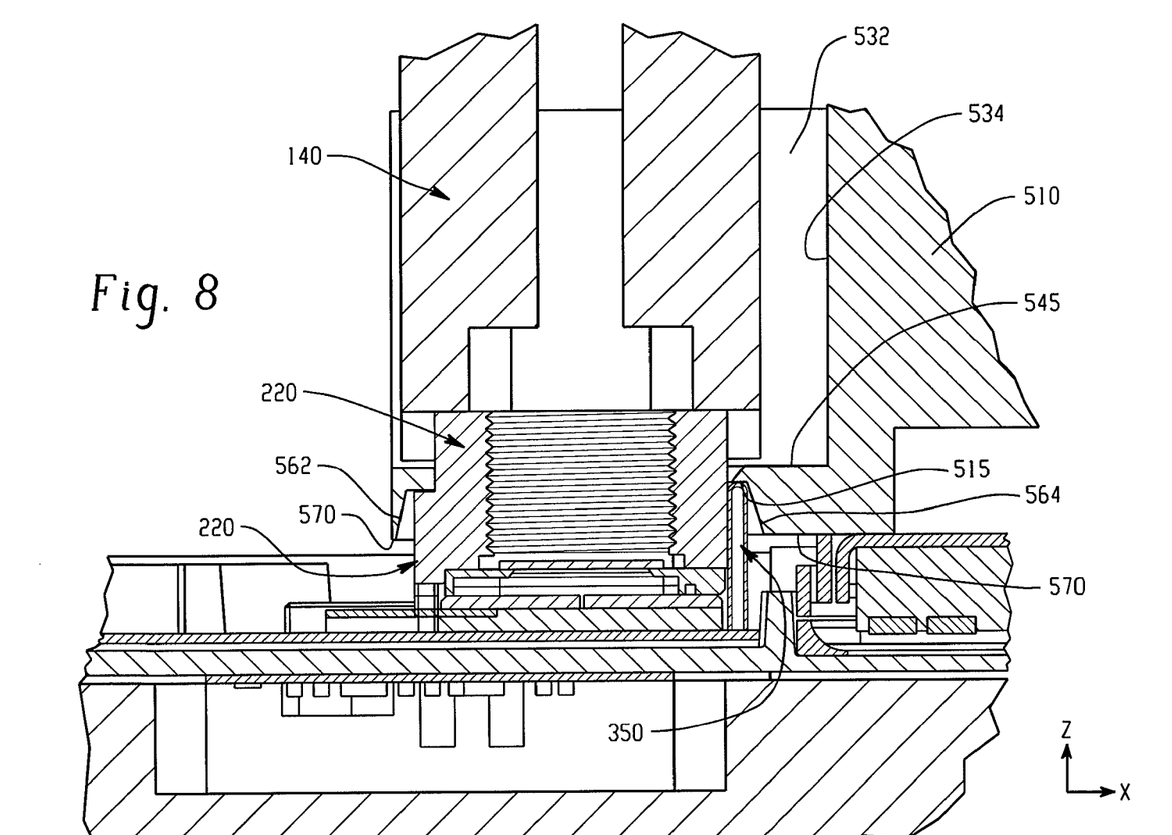
FIG. 8 shows a cross-sectional view of an example gripper apparatus with an example control block and insertion height control rod, and an example assembly track.

The spring 110 is attached to a two-part carriage 115, which is part of the gripper head 140, and which includes a first part 120 and a second part 125 that are attached by a sliding rod 130. In this example, the first part 120 and the second part 125 are slidable on a single-axis linear slide mechanism. Specifically, the second part 125 is slidably mounted on the rod 130 along the x-axis and is movable in relation to the first part 120, and the first part 120 is slidably mounted on the rod 130 along the x-axis and is movable in relation to the second part 125. When the first part 120 and second part 125 are moved apart, the gripper head 140 is in an open position (FIG. 7), and when the first part 120 and second part 125 are moved together the gripper head 140 is in a closed position. In other examples, only one of the first part 120 and second part 125 are independently movable on the x-axis, and the other part is fixed. The movement is powered by the computer-controlled air cylinder (not shown).

Figure 3:
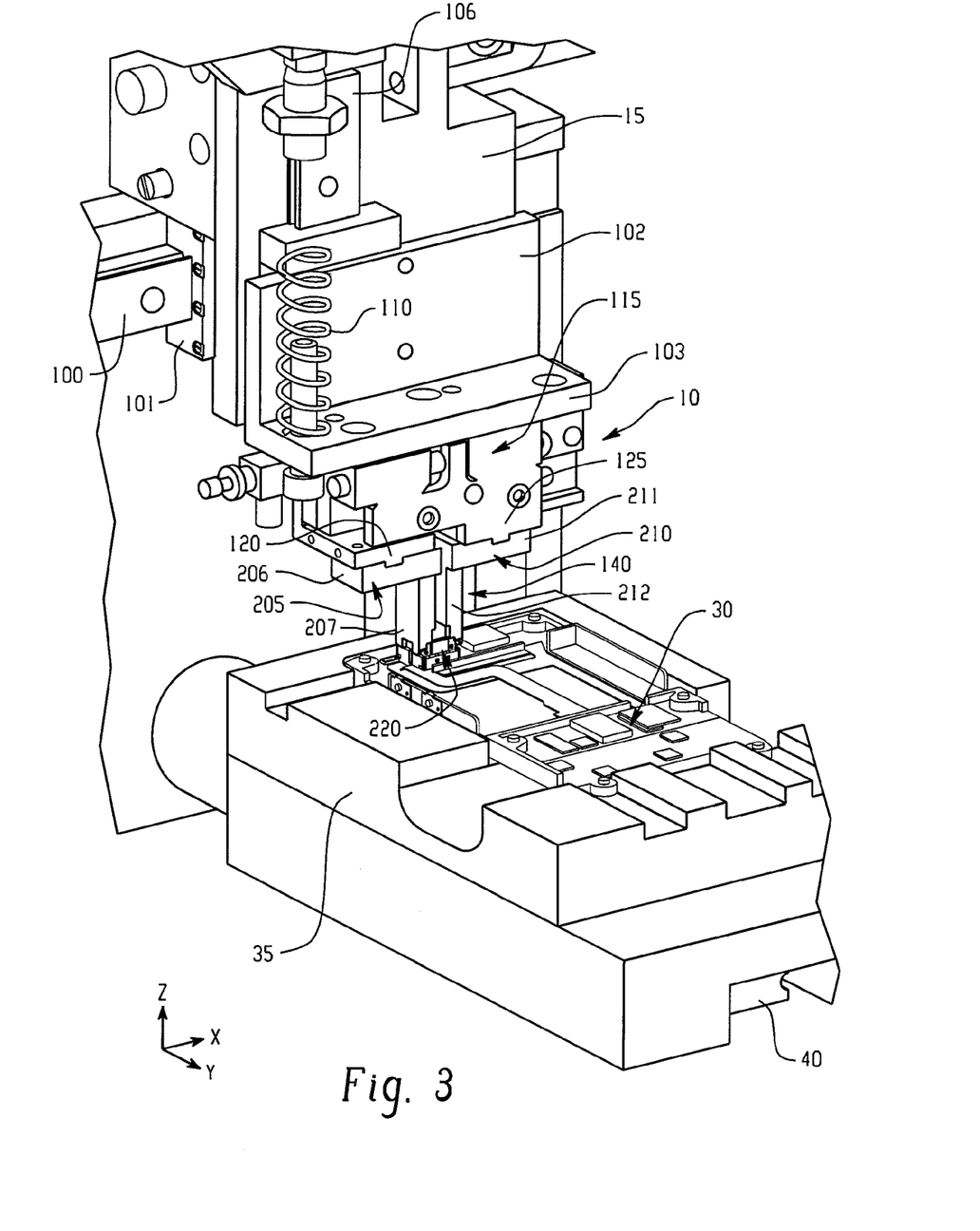
FIG. 3 is a second, magnified, perspective view of an example gripper apparatus and an example assembly track.
Figure 3A:
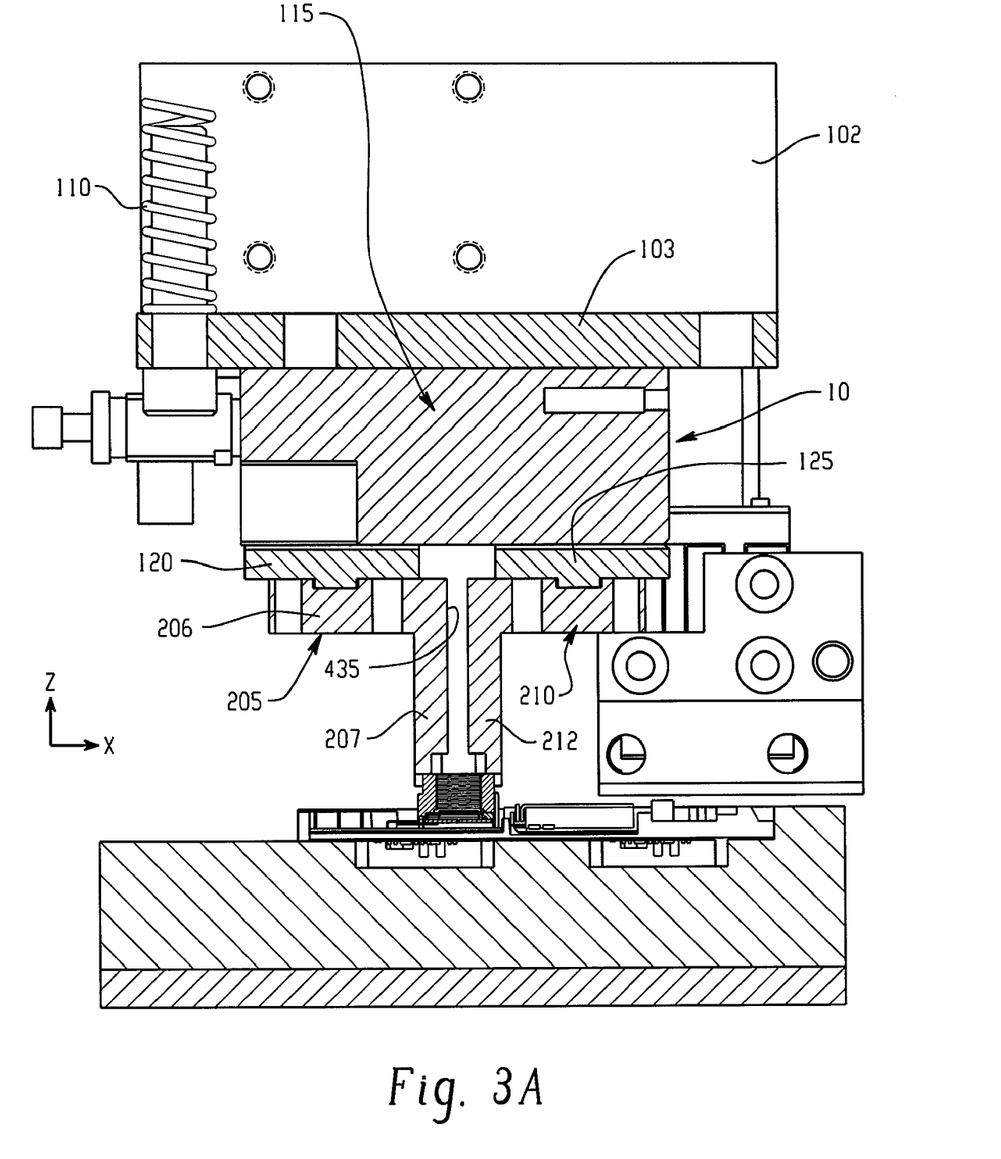
FIG. 3A shows a cross-sectional view of an example gripper apparatus and an example assembly track.

A gripper head 140 is attached to the first part 120 and second part 125 of the two-part carriage 115. FIGS. 3 and 3A show a closer, more detailed view of the gripper assembly 10 and gripper head 140. A first extension 205 has an extension in the x-axis 206 and also has an extension along the z-axis 207 to make an L-shape. The x-axis extension 206 is connected to the first part 120, and the z-axis extension 207 terminates the bottom end of the gripper assembly 10 and is configured to contact an electronic component 220. Similarly, a second extension 210 has an extension in the x-axis 211 and also has an extension along the z-axis 212 to make an L-shape. The x-axis extension 211 is connected to the second part 125, and the z-axis extension 212 terminates the bottom end of the gripper assembly 10 and is configured to contact the electronic component 220.

FIG. 4, FIG. 4A, FIG. 4B and FIG. 5 show a closer, more detailed view of how the gripper head 140 interacts with the electronic component 220 and PCB 30.

An electronic component 220 has first and second sides 305, 310 opposite each other, and third and fourth sides 312, 314 opposite each other and perpendicular to the first and second sides 305, 310. A top face 315 of the electronic component has a top-face peripheral area 320 (shaded area FIG. 4A) and a top-face central area 325. Four corner areas 328 (cross-hatched shaded areas in FIG. 4A) are included as part of the top peripheral face 320. The electronic component 220 also has a key 330 on the first side 305. The bottom face of the electronic component 220 has electrical connections. In this example, the electronic component 220 is a camera unit. The camera unit is a pressure sensitive electronic component because the lens disposed on the top face central area 325 cannot withstand the typical pressure used in vacuum-based manufacturing assembly equipment or other machinery or labor that mechanically or manually applies force on the center of the component. Other pressure sensitive electronic components may include, but are not limited to, certain microphones, receivers or speakers.

Figure 4:
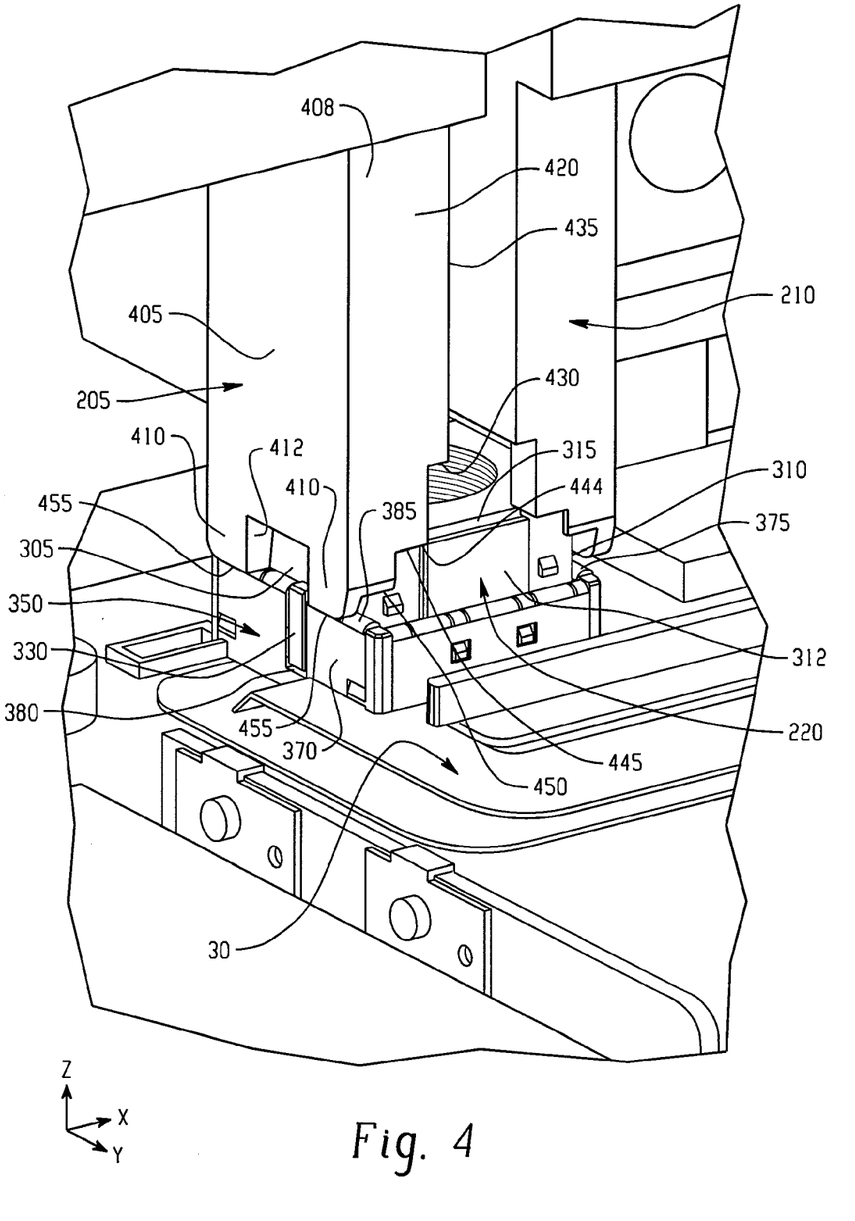
FIG. 4 shows a third, magnified, perspective view of an example gripper apparatus and an example assembly track.
Figure 4A:
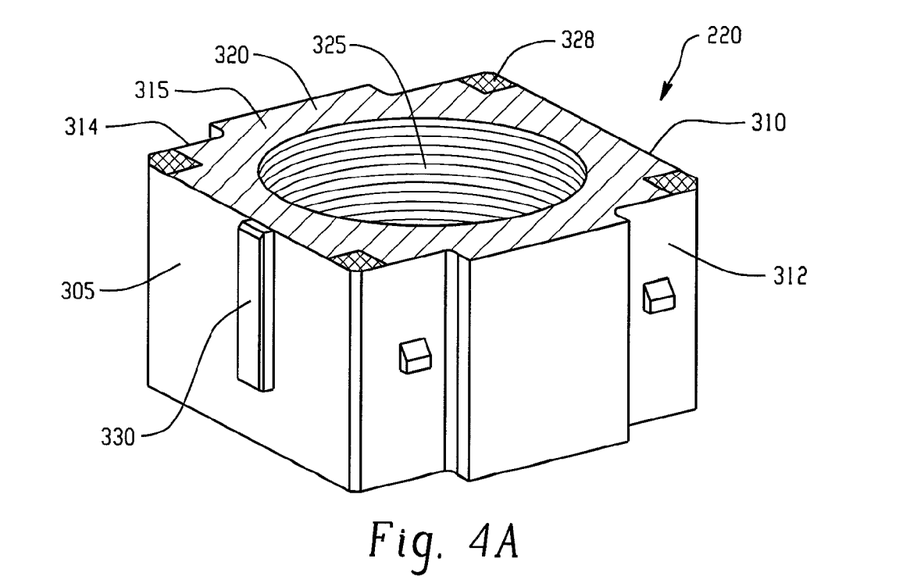
FIG. 4A shows a perspective view of an example electronic component.
Figure 4B:
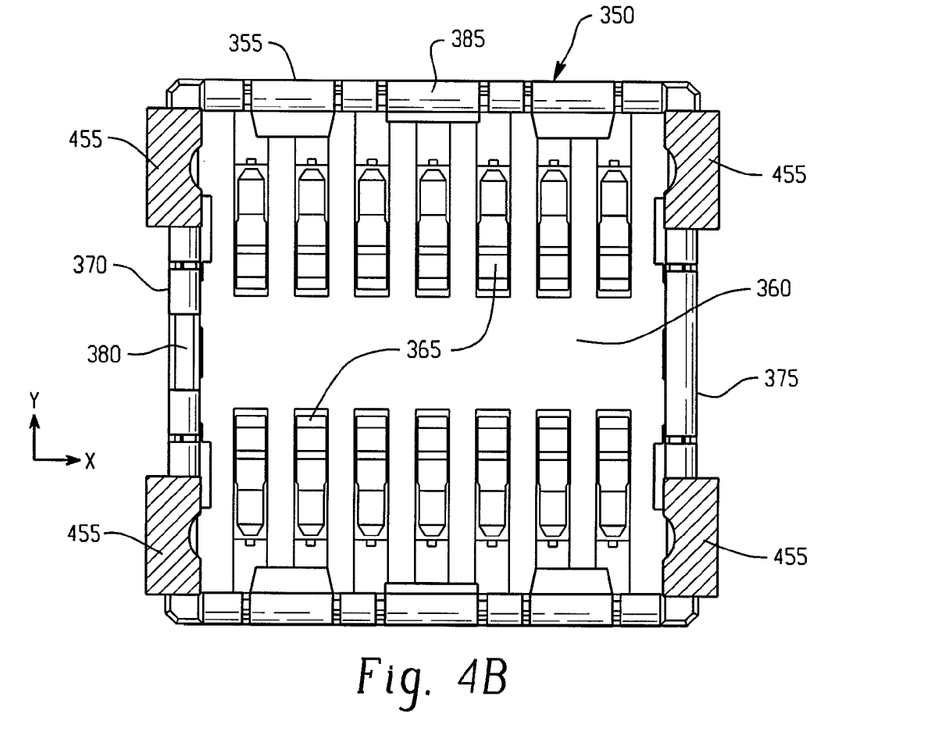
FIG. 4B shows a top-down cross-sectional view of example gripper corner extensions and an example socket.

A socket 350 is electrically and physically connected to the PCB 30 and includes walls 355 circumscribing a socket floor 360 (See FIG. 4B). The socket floor 360 contains several electrical contacts 365 that are electrically coupled to the PCB 30. The socket walls 355 include a first socket wall 370 and a second socket wall 375. A key-hole section 380 is cut-out of the first socket wall 370 and is open to the top of the socket 350. The key-hole section 380 allows entry of the key 330 in the electronic-component 220 to aid in proper alignment. The socket walls 355 have a top peripheral face 385 circumscribing the top of the socket 350.

In the example shown in FIG. 4, the first extension 205 and second extension 210 of the gripper head 140 extend down and partially surround the electronic component 220. The gripper head 140 is shown in the closed position, gripping the electronic component 220. In the open position, the first extension 205 and second extension 210 are spaced apart to a distance greater than the x-axis width of the electronic component 220. In this example, the first extension 205 and second extension 210 are mirror images of each other; however, in other examples their particular shapes may differ.

Because the first and second extensions 205, 210 are mirror images of each other, the following description focuses on the first extension 205, but applies to both extensions 205, 210. The first extension 205 has four sides. The first side 405 extends in the y and z planes. At the bottom end of the first side 405, two corner extensions 410 border a notch 412 cut out of the first side 405. The notch 412 is open to the bottom of the gripper head 140, and enables the key 330 on the electronic component 220 to extend between the corner extensions 410 when the gripper head 140 is in the closed position.

Interior surfaces 414 (FIG. 5) of the corner extensions 410 contact the first side 305 (or in the case of the second extension, the second side 310) of the electronic component 220. The corner extensions 410 have a thickness that extends across the x-axis width of the top peripheral face 385 of the socket 350. The interior surfaces 414 of the corner extensions 410 grip the electronic component 220 when the gripper head 140 is in the closed position by pushing against the first and second sides 305, 310 of the electronic component 220. This interior surface 414 may optionally be provided with a high-friction surface to enhance the grip of the gripping head 140. The interior surface 414 may also optionally be provided with a soft or cushioned surface to cushion the force of the grip.

A second side 420 and a third side (not shown) of the first extension 205 run perpendicular to the first side 405 in the x and z planes. In the present example, as the second side 420 and third side extend down the z-axis, they recede in unison away from the center of the gripper head 140 along the x-axis in a stair-stepped manner. The same recessed steps are formed in both sides, thus only the second side is described in detail, with the understanding that the third side has the same form.

Prior to a first recessed step 430, a fourth side 435 (See FIG. 3A), which is opposite the first side 405, extends across the entire width of the gripper head 140 and connects with the third side.

At the first recessed step 430, the gripper head 140 has a recess 440 (FIG. 5) bounded by the interiors of the first side 405, second side 420, and third side, which provides a clearance so the central area 325 of the electronic component 220 is not contacted by the gripper head 140.

Figure 5:
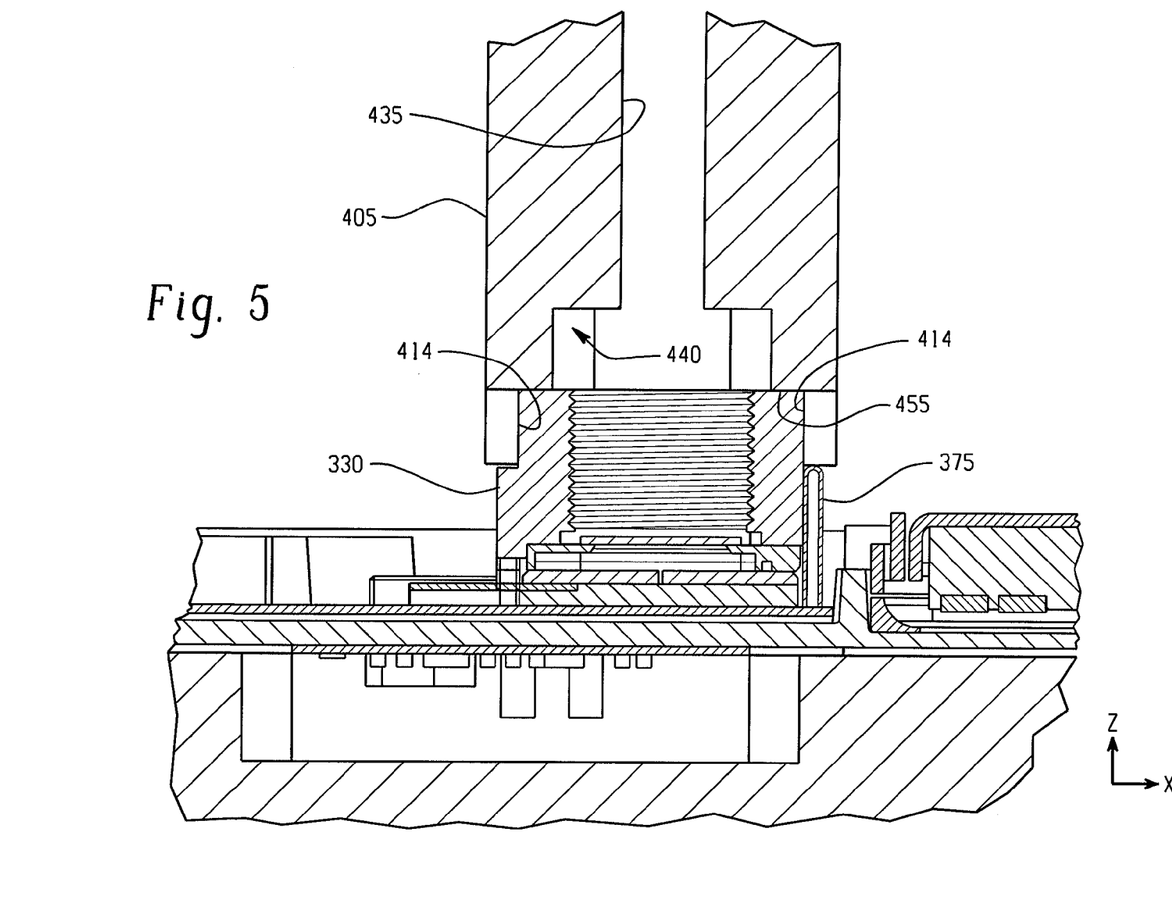
FIG. 5 shows a cross-sectional view of an example gripper apparatus and an example assembly track.

At a second recessed step 444, a lip 445 is formed on the bottom side thereof. This lip 445 is an extension that has a thickness in the y and x plane such that when the gripper head 140 is in the closed position it will be situated over the top peripheral face 320 of the electronic component 220. The lip 445 of the first extension 205, may be considered to extend toward the lip 445 of the second extension 210. Specifically, the lip 445 contacts the electronic component 220 at a corner area 390 of the top peripheral face 385 where the electronic component 220 is less susceptible to damage. For example, the top peripheral face 385 and the corner area 390 of the top peripheral face 385 of pressure sensitive camera units are better able to withstand pressure than the central area 325 where the lens is disposed.

As the second side 420 extends down the z-axis from the second 444 to a third recessed step 450, the y-axis thickness of the second side 420 is reduced so that a thin wall is formed that contacts or nearly contacts (e.g. within 3 mm) the third and fourth sides 312, 314 of the electronic component 220.

The third recessed step 450 extends along the x-axis to the edge of the first side 305 of the electronic component 220. After the third recessed step 450, the second side 420 merges into the x-axis thickness of the corner extensions 410 of the first side 405, which extend below the third recessed step 450.

In this example, a bottom surface 455 of the four corner extensions 410 of the gripper head 140 (on both the first and second extensions 205, 210) contacts the top peripheral surface 385 of the socket 350. Specifically, the bottom surface 455 contacts the front and back areas of the first socket wall 370 and the second socket wall 375. In this example, the bottom surface 455 of the corner extensions 410 functions as an insertion depth guide by acting as a stopper against the top peripheral surface 385 of the socket 350. This controls the depth of insertion of the electronic component 220 into the socket 350 and prevents excessive force on the electronic component 220 and the floor 360 of the socket 350. In this example, the distance between the lip 445 and the bottom surface 455 of the corner extensions 410 should be the same as the distance between top peripheral surface 320 of the electronic component 220 and the top peripheral surface 385 of the socket 350 when the electronic component 220 is securely seated in the socket 350. The depth insertion guide feature also ensures a correct orientation on the z-axis by making the top peripheral surface 320 of the electronic component 220 and the top peripheral surface 385 of the socket 350 level.

Figure 6:
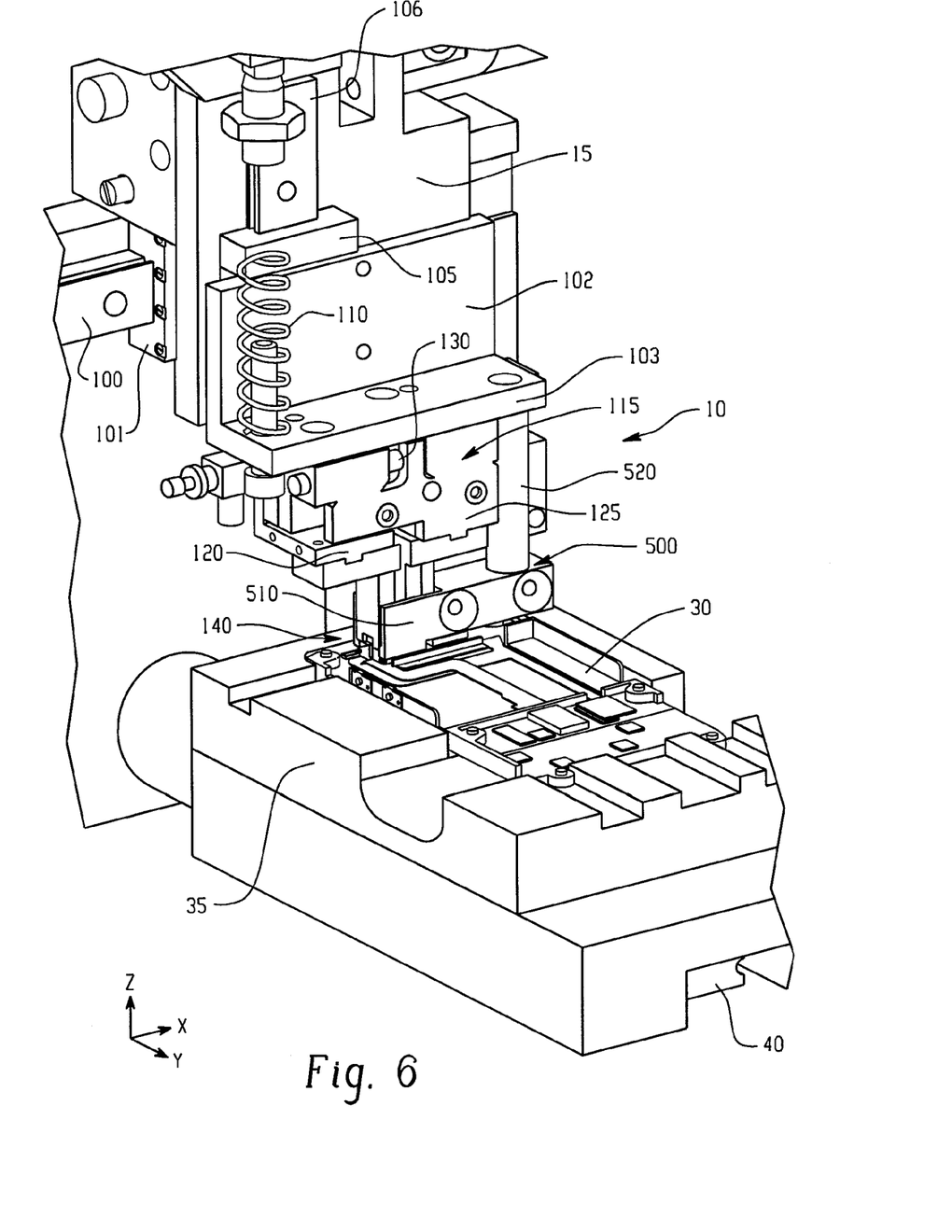
FIG. 6 shows a perspective view of an assembly mechanism including an example gripper apparatus, an example control block and insertion height control rod, and an example assembly track.

In another example, shown in FIGS. 6-9, the depth insertion guide is an independent piece that is separate from the gripper head 140. FIG. 6 shows the same apparatus described above and shown in FIGS. 1-5, except an example control block insertion depth guide 500 is added. In this example, the control block insertion depth guide 500 functions as the insertion depth guide instead of the bottom surface 455 of the four corner extensions 410 of the gripper head 140. The separate control block configuration protects the socket 350 from excessive force and functions to ensure that the socket 350 and electronic component 220 are correctly aligned.

The example control block insertion depth guide 500 comprises a control block 510 and an insertion height control rod 520. The example control block 510 is separately mounted and does not move in the x-axis or y-axis, even when the gripper head 140 is sliding on the x-axis to retrieve an electronic component 220 from the tape feeder 45. The control block 510, however, is mounted so that it can slide to an up and a down position along the z-axis.

The control block 510 is biased by a spring (not shown) such that the control block 510 will rise to the up position when no other force is applied to it. In the up position, the bottom of the control block 510 is raised above the PCB 35 to allow for clearance of the PCB 35 when the electronic component 220 is inserted (See FIG. 7). In the down position (See FIGS. 6 and 8) the control block 510 is pressed down so that a bottom surface 515 of a ledge 545 on the control block 510 contacts the top peripheral surface 385 of the socket 350, thereby stopping the downward motion of the control block 510. Other types of range-limiting stoppers can be utilized alternatively or in conjunction with the above. For example, a fixed surface mounted underneath the control block 510 may be configured to limit the range of the downward motion of the control block 510.

The example insertion height control rod 520 is secured to the bottom ledge 103 of the L-shaped angled mounting plate 102. Thus, the insertion height control rod 520 travels along with the gripper head 140 as it moves in the x- and z-axes. The bottom surface 522 of the insertion height control rod 520 is configured to contact the top surface 512 of the control block 510 when the gripper head 140 moves down along the z-axis. Thus, the insertion height control rod 520 controls the downward (z-axis) range of the gripper head 140 and control block 510.

Figure 9:
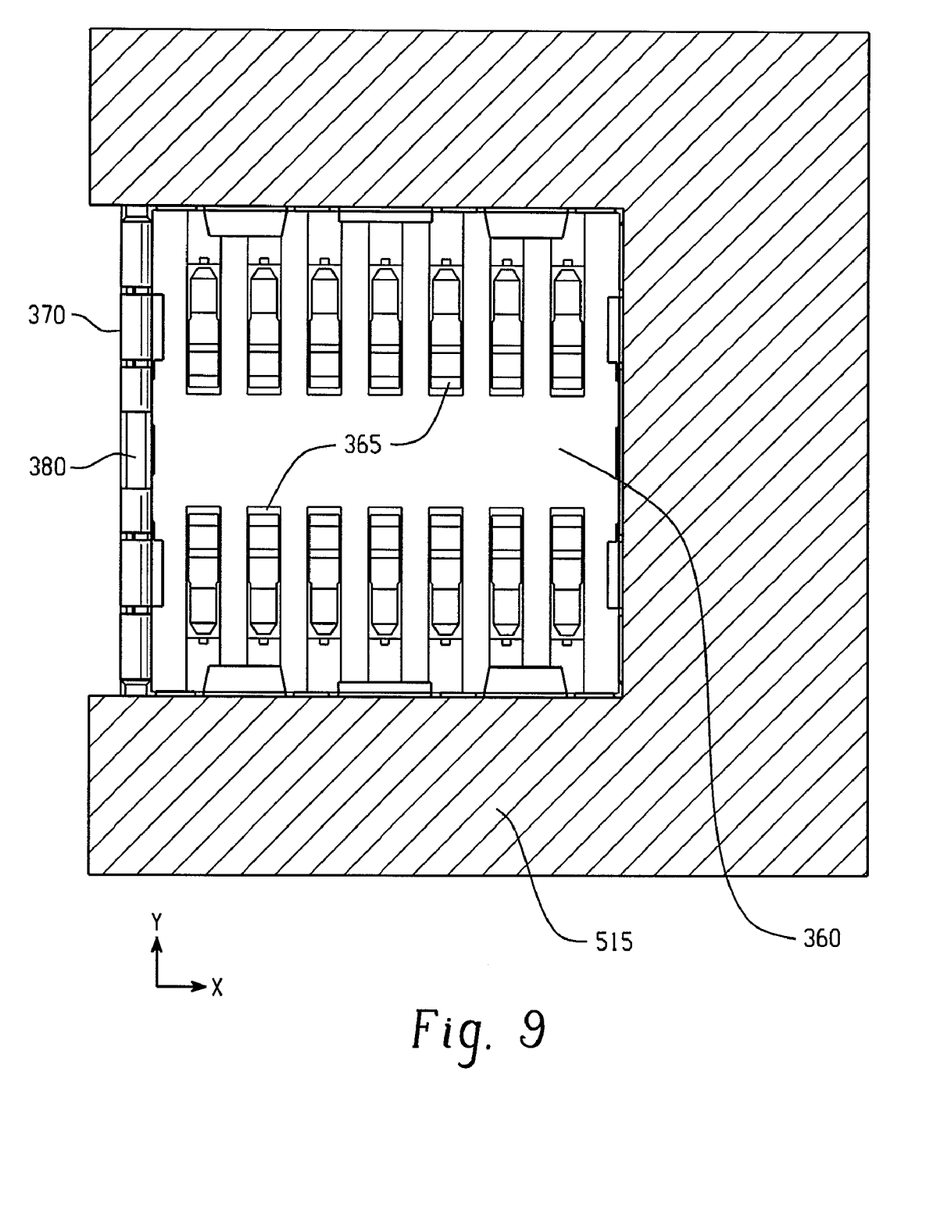
FIG. 9 shows a top-down cross-sectional view of an example control block and an example socket.

The control block 510 has a well 530 defined by first, second, and third walls 532, 534, 536, respectively. The well 530 is open to the direction where the electronic component 220 is stored on the tape feeder 45. The control block 510 is positioned so that the z-axis extensions 207, 212 of the gripper head 140 will fit into the well 530 when the gripper head 140 is in position over the socket 350 of the PCB 30. The second wall 534 is recessed enough to allow the gripper head 140 to be in the open position when it is in the well 530. A bottom 540 of the well 530 is open, but is circumscribed by a ledge 545 that runs along the first, second, and third walls 532, 534, 536, respectively. The ledge 545 is tapered so that it is wider at the bottom than at the top, providing a centering feature that directs the gripper head 140, the electronic component 220, or both into the precisely correct position in the socket 350.

An bottom surface 570 of the control block 510 also provides another centering feature. Underneath the ledge 545, first, second, and third under-ledge walls 562, 564, 566 taper outwardly to the bottom surface 570 of the control block 510. The under-ledge walls 562, 564, 566 extend below the socket 350 when the control block 510 is in the down position and function to direct the control block 510 into the precisely correct position over the socket 350. The control block 510, therefore serves to center both the gripper head 140 (with electronic component 220) and the socket 350 into mutual alignment.

Figure 10:
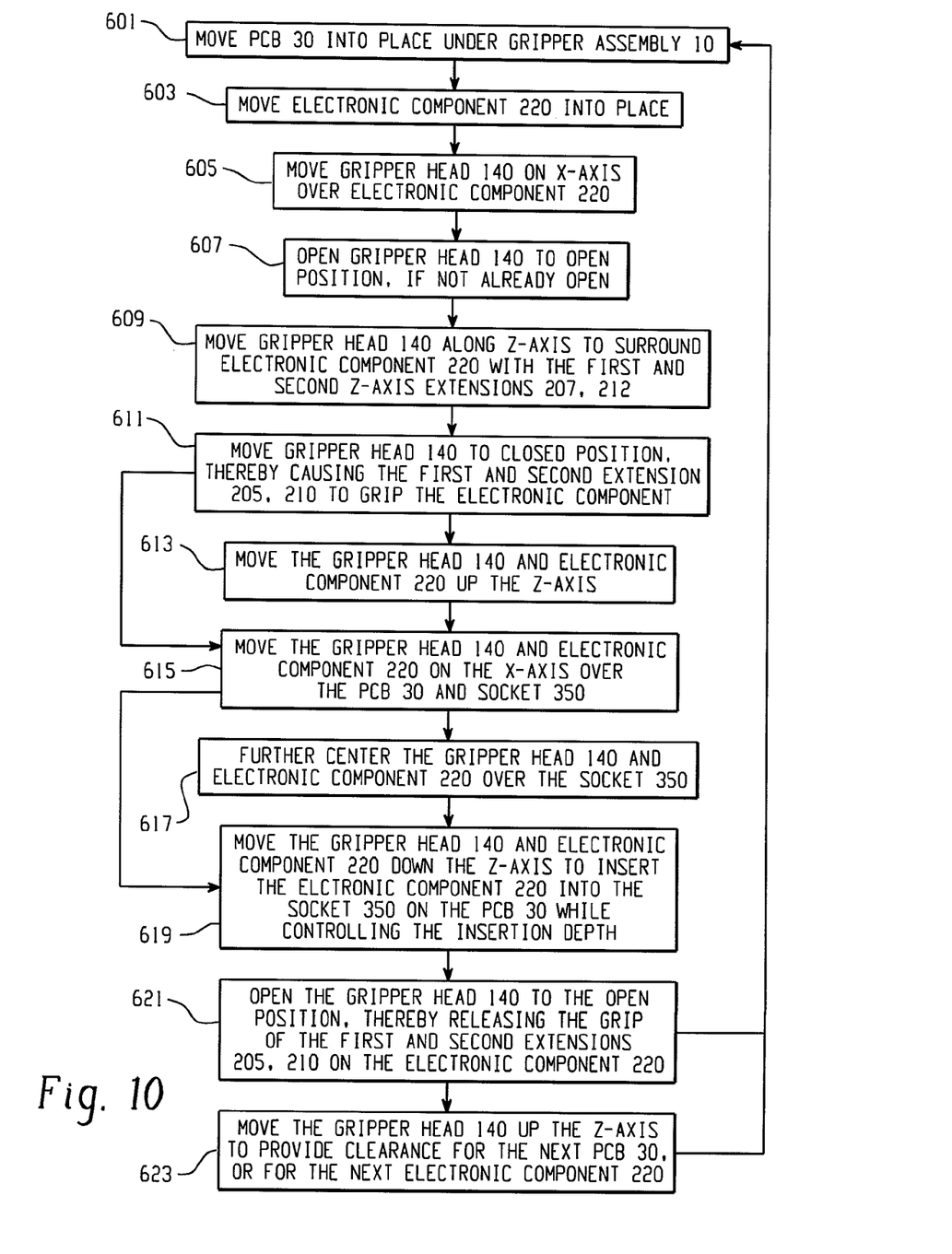
FIG. 10 is an example flow-chart of an assembly process using an example assembly mechanism.

FIG. 10 is a flow chart of an example method for placing an electronic component 220 into a socket 350 disposed on a PCB 30. First, a PCB 30 is moved into place under a gripper assembly 10 (601). The PCB 30 may be situated in a PCB nest 35 and brought under the gripper assembly 10 by traveling along a rail 40 in and out from under the gripper assembly. Concurrently, or before or after step 610, the electronic component 220 is moved into a position proximate to the gripper assembly 10 (603). In one example, the electronic component 220 is placed directly across from the socket 350 on the x-axis.

Once the PCB 30 and electronic component 220 are in place, the gripper head 140, powered, in this example, by a computer-controlled air cylinder 19, moves along the x-axis to a location directly above the electronic component 220 (605). If the gripper head 140 is not open already, the gripper head 140 is moved to the open position (607), thereby causing the first and second extensions 205, 210 on the gripper head 140, and also the first and second z-axis extensions 207, 212, to be spaced apart to a distance greater than the width of the electronic component 220.

The gripper head 140 is then moved down on the z-axis so that the portion of the z-axis extensions 207, 212 that extends below the lip 445 of the gripper head 140 surround portions of at least two opposing sides of the socket 350 (609). The gripper head 140 is then moved to the closed position, thereby causing the first and second z-axis extensions 207, 212 to grip the electronic component 220 underneath the lip 445 of the gripper head 140 (611). At this point, the lip 445 may contact the top peripheral face 320 of the electronic component 220 or it may be slightly above the top peripheral face 320 of the electronic component 220, e.g. 0.01 mm to 5 mm above the top peripheral face 320, such as 0.5 mm to 4 mm, or 1 mm to 3 mm.

The gripper head 140 is then moved or operated to a closed position, thereby grasping the electronic component 220 between the first z-axis extension 207 and second z-axis extension 212 and beneath the first and second lips 445 (611).

At this point, depending on where the PCB 30 and electronic component 220 originally were located on the z-axis in relation to each other, the gripper head 140 and electronic component 220 can (1) move back up along the z-axis (613) (in a reverse direction from the previous z-axis movement) and then move along the x-axis to a location above the socket 350 on the PCB 30 (615); or (2) move directly along the x-axis to a location above the socket 350 on the PCB 30 (615). Either option may be selected so long as the electronic component 220 and the gripper head 140 are able to clear the top peripheral face 385 of the socket walls 355 as the electronic component 220 and the gripper head 140 are moved over the socket 350. For example, option (2) may be selected if the top peripheral face 385 of the socket walls 355 is situated lower on the z-axis than the surface on which the electronic component 220 was originally situated, and if there are no barriers that would hinder direct movement along the x-axis from the original location of the electronic component 220.

The computer controlled air cylinder 19 is programmed to move the gripper head 140 and electronic component 220 in alignment with the socket 350 on the x-axis (615). The y-axis alignment is controlled in step 601 by the placement of the PCB 30 underneath the gripper assembly 10. Stoppers or location locking mechanisms as known by those of skill in the art may be used to aid in achieving correct aligmnent. In one example, this alignment, in conjunction with the depth insertion guide function of the corner extensions 410 of the gripper head 140, is sufficient to allow the electronic component 220 to be placed securely into the socket 350.

An optional additional step (617) allows for finer centering of the gripper head 140, electronic component 220 and socket 350. In an example that uses the control block 510 and insertion height control rod, the control block 510 serves to center both the gripper head 140 (with electronic component 220) and the socket 350 into mutual alignment, as described above.

After moving the gripper head 140 and electronic component 220 over the socket 350, the gripper head 140 moves down the z-axis to place the electronic component 220 into the socket 350 (619). The fine centering of step 617 takes place as the electronic component 220 is inserted into the socket 350. As the electronic component 220 is inserted, it encounters some resistance from the socket walls 355, the electrical connections 365 in the socket floor 360, or the socket floor 360 itself. This resistance will tend to push the electronic component 220 up so that it squarely abuts the lips 445 of the gripper head 140. The lips 445 of the gripper head 140 are configured to make the electronic component 220 level in the x-y plane, so that it will be correctly oriented in the socket 350. The lips 445 of the gripper head 140 pushes against the top-face peripheral area 320 of the electronic component 220 to overcome the resistance as it is fully inserted into the socket 350. This ensures that the electronic component 220 is pushed into the socket 350 securely and in the correct orientation while avoiding pressure sensitive areas that may be present at the central area 325 of the electronic component 220. The example insertion depth guides discussed above also aid in providing correct orientation as they press against the top peripheral face 385 of the socket 350.

The insertion depth is controlled to prevent excessive pressure on the electronic component 220, socket 350, and PCB 30. For example, the example insertion depth guides discussed above may be used for this purpose, i.e. the bottom surface 455 of the corner extensions 410 or the control block insertion depth guide 500.

After the electronic component 220 is securely inserted into the socket 350, the gripper head 140 is opened to the open position, thereby releasing the grip of the first and second extensions 205, 210 on the electronic component 220 (621).

At this point another PCB may be moved into place under the gripper assembly 10 (601) and the process can start again. Optionally, to provide greater clearance for the next PCB 30 or the next electronic component the gripper may be moved back up the z-axis (623) before the process begins again at step 601.

While various features of the claimed camera module insertion machine with gripper are presented above, it should be understood that the features may be used singly or in any combination thereof. Therefore, the claimed machine is not to be limited to only the specific examples depicted herein. The scope of the disclosure is accordingly defined as set forth in the appended claims.

What is claimed is:

1. Apparatus comprising:
    a gripper having a gripper head, the gripper head having an extension pair movable between an open position and closed position; the extension pair configured to contact opposing sides of an electronic component when the gripper head is in the closed position and each extension of the extension pair has a surface configured to contact a top-face peripheral area of the electronic component when the gripper head is in the closed position;
    an insertion depth guide associated with the gripper head, the insertion depth guide having a bottom surface; and
    wherein the bottom surface of the insertion depth guide is configured to contact a top peripheral surface of an electronic component socket when the gripper is used to insert an electronic component into the electronic component socket.

2. The apparatus of claim 1, wherein the extension pair of the gripper is slidable only in two dimensions.

3. The apparatus of claim 1, wherein the surfaces of the extension pair contacts the electronic component at only two to four corner areas of the top-face peripheral area of the electronic component.

4. The apparatus of claim 1, wherein the electronic component is a pressure sensitive electronic component.

5. The apparatus of claim 4, wherein the pressure sensitive electronic component is selected from the group consisting of: a camera unit, a speaker, a receiver, and a microphone.

6. The apparatus of claim 1, wherein the insertion depth guide comprises a bottom surface of the gripper head that contacts the top peripheral surface of the electronic component socket to act as a stopper and control the insertion depth of the electronic component into the electronic component socket.

7. The apparatus of claim 1, wherein the insertion depth guide comprises an insertion height control rod coupled to the gripper configured to contact a control block, and wherein a bottom surface of the control block contacts the top peripheral surface of the electronic component socket when the gripper is used to insert an electronic component thereinto.

8. The apparatus of claim 7, wherein the control block comprises three-sides encompassing a well with a ledge circumscribing a bottom of the well, wherein the ledge comprises tapered sides, the tapered sides of the ledge being configured to direct the electronic component, the gripper head, or both into alignment with the electronic component socket.

9. The apparatus of claim 7, wherein the control block comprises three-sides encompassing a well with a ledge circumscribing a bottom of the well, and beneath the ledge, tapered under-ledge walls to align the electronic component socket with the gripper head, the electronic component, or both.

10. An apparatus for seating an electronic component within a socket, the apparatus comprising:
    a gripper support structure comprising a first linear slide mechanism for movement on a z-axis, and a second linear slide mechanism for movement on an x-axis;
    a gripper head coupled to the support structure, the gripper head comprising a first extension and a second extension movable between an open position and closed position, the first extension having a first lip extending toward the second extension and the second extension having a second lip extending toward the first extension, the first and second lip configured to contact a top-face peripheral area of an electronic component when the gripper head is in the closed position: and an insertion depth guide associated with the gripper head.

11. The apparatus of claim 10 wherein, in the closed position, the extensions are configured to grip and retain the component under the lip.

12. The apparatus of claim 10, wherein the gripper moves only in two dimensions.

13. The apparatus of claim 10, wherein a bottom surface of the gripper head is the insertion depth guide, whereby the insertion depth guide acts as a stopper to limit the insertion depth of the component.

14. The apparatus of claim 10, wherein the insertion depth guide comprises an insertion height control rod coupled to the gripper support structure, the insertion height control rod being configured to (1) contact a separately mounted control block, movable only in the z-axis, and (2) to move the control block from an up position to a down position, wherein the control block acts as a stopper to limit the insertion depth of the component.

15. The apparatus of claim 14, wherein the control block comprises three-sides encompassing a well with a ledge circumscribing a bottom of the well, wherein the ledge comprises tapered sides, the tapered sides of the ledge being configured to align the gripper head.

16. The apparatus of claim 14, wherein the control block comprises three-sides encompassing a well with a ledge circumscribing a bottom of the well, and beneath the ledge, tapered under-ledge walls.

17. The apparatus of claim 10, wherein the first and second extensions are movable from the open to closed position on a single-axis linear slide mechanism.

18. The apparatus of claim 10, wherein the gripper comprises computer controlled air cylinders that provide sliding movement of the gripper in the x-axis and z-axis.

19. Apparatus comprising:
gripping means including means for contacting a peripheral area of an electronic component;
means for operating the gripping means between an open and a grasping position;
means for moving the gripping means along an x-axis;
means for moving the gripping means along a z-axis;
means for controlling an insertion depth; and
wherein the apparatus is operable to grasp a peripheral area of an electronic component and locate the grasped electronic component over a socket and insert the grasped electronic component into the socket at a controlled insertion depth.

20. The apparatus of claim 19 further comprising means for moving the gripping means in a reverse direction on the z-axis.

* * * * *